(12) United States Patent
Pal et al.

(10) Patent No.: US 10,026,645 B2
(45) Date of Patent: Jul. 17, 2018

(54) MULTIPLE PATTERNING PROCESS FOR FORMING PILLAR MASK ELEMENTS

(71) Applicant: GLOBALFOUNDRIES Inc., Grand Cayman (KY)

(72) Inventors: Shyam Pal, Clifton Park, NY (US); Granger Lobb, Clifton Park, NY (US); Aleksandra Clancy, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 36 days.

(21) Appl. No.: 15/253,097

(22) Filed: Aug. 31, 2016

(65) Prior Publication Data

US 2018/0061699 A1    Mar. 1, 2018

(51) Int. Cl.
*H01L 21/4763* (2006.01)
*H01L 21/768* (2006.01)
*H01L 21/033* (2006.01)
*H01L 21/311* (2006.01)

(52) U.S. Cl.
CPC .... *H01L 21/76802* (2013.01); *H01L 21/0332* (2013.01); *H01L 21/0337* (2013.01); *H01L 21/31144* (2013.01); *H01L 21/76877* (2013.01)

(58) Field of Classification Search
CPC ........... H01L 21/76802; H01L 21/0332; H01L 21/0337; H01L 21/31144; H01L 21/76877
See application file for complete search history.

(56) References Cited

U.S. PATENT DOCUMENTS

2009/0087993 A1* 4/2009 Maxwell ............. H01L 21/0337 438/703

* cited by examiner

*Primary Examiner* — Joseph C Nicely
*Assistant Examiner* — Vicki B Booker
(74) *Attorney, Agent, or Firm* — Amerson Law Firm, PLLC

(57) ABSTRACT

A method includes forming a stack of hard mask layers above a process layer. The stack includes first, second and third hard mask layers. The third hard mask layer is patterned to define therein a first mask element and to expose portions of the second hard mask layer. The second hard mask layer is patterned to define therein a second mask element below the first mask element and a third mask element, and to expose portions of the first hard mask layer. The first hard mask layer is patterned to define therein a fourth mask element below the second mask element, a fifth mask element below the third mask element, and a sixth mask element, and to expose portions of the process layer. The process layer is etched to remove portions of the process layer not covered by the first hard mask layer.

18 Claims, 6 Drawing Sheets

MULTIPLE PATTERNING PROCESS FOR FORMING PILLAR MASK ELEMENTS

BACKGROUND OF THE INVENTION

1. Field of the Invention

The disclosed subject matter relates generally to the fabrication of semiconductor devices and, more particularly, to a multiple patterning process for forming pillar mask elements.

2. Description of the Related Art

Photolithography is one of the basic processes used in manufacturing integrated circuit products. At a very high level, photolithography involves: (1) forming a layer of light or radiation-sensitive material, such as photoresist, above a layer of material or a substrate; (2) selectively exposing the radiation-sensitive material to a light generated by a light source (such as a DUV or EUV source) to transfer a pattern defined by a mask or reticle (interchangeable terms as used herein) to the radiation-sensitive material; and (3) developing the exposed layer of radiation-sensitive material to define a patterned mask layer. Various process operations, such as etching or ion implantation processes, may then be performed on the underlying layer of material or substrate through the patterned mask layer.

Of course, the ultimate goal in integrated circuit fabrication is to faithfully reproduce the original circuit design on the integrated circuit product. Historically, the feature sizes and pitches employed in integrated circuit products were such that a desired pattern could be formed using a single patterned photoresist masking layer. However, in recent years, device dimensions and pitches have been reduced to the point where existing photolithography tools cannot form a single patterned mask layer with all of the features of the overall target pattern. Accordingly, device designers have resorted to techniques that involve performing multiple exposures to define a single target pattern in a layer of material. One such technique is generally referred to as multiple patterning, e.g., double patterning. In general, double patterning is an exposure method that involves splitting (i.e., dividing or separating) a dense overall target circuit pattern into two separate, less-dense patterns. The simplified, less-dense patterns are then printed separately on a wafer utilizing two separate masks (where one of the masks is utilized to image one of the less-dense patterns, and the other mask is utilized to image the other less-dense pattern). Further, in some cases, the second pattern is printed in between the lines of the first pattern such that the imaged wafer has, for example, a feature pitch which is half that found on either of the two less-dense masks. This technique effectively lowers the complexity of the photolithography process, improving the achievable resolution and enabling the printing of far smaller features that would otherwise be impossible using existing photolithography tools. The self-aligned double patterning (SADP) process is one such multiple patterning technique. The SADP process may be an attractive solution for manufacturing next-generation devices, particularly metal routing lines on such next-generation devices, due to better overlay control that is possible when using an SADP process.

In some cases, it is desirable to alter the SADP masking structure to affect the features formed. For example, a blocking mask element may be formed above the SADP masking structure to define a cut in the line feature to be formed. Due to the already small dimensions of the SADP masking structure, it is also difficult to form the blocking mask elements due to photolithography constraints.

The present application is directed to various methods for forming vias so as to eliminate or reduce the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods for performing a multiple patterning process for forming pillar mask elements. One illustrative method includes, among other things, forming a stack of hard mask layers above a process layer. The stack includes first, second and third hard mask layers. The third hard mask layer is patterned to define therein a first mask element and to expose portions of the second hard mask layer. The second hard mask layer is patterned to define therein a second mask element below the first mask element and a third mask element, and to expose portions of the first hard mask layer. The first hard mask layer is patterned to define therein a fourth mask element below the second mask element, a fifth mask element below the third mask element, and a sixth mask element, and to expose portions of the process layer. The process layer is etched to remove portions of the process layer not covered by the first hard mask layer.

Another illustrative method includes, among other things, forming a first dielectric layer above a substrate. A first hard mask layer is formed above the first dielectric layer. A patterned etch mask comprising a plurality of spaced-apart line elements is formed above the first hard mask layer. A second dielectric layer is formed above the patterned etch mask. A second hard mask layer is formed above the second dielectric layer. A third hard mask layer is formed above the second hard mask layer. A fourth hard mask layer is formed above the third hard mask layer. The fourth hard mask layer is patterned to define therein a first mask element aligned with a first pair of the spaced-apart line features and to expose portions of the third hard mask layer. The third hard mask layer is patterned to define therein a second mask element below the first mask element and a third mask element aligned with a second pair of the spaced-apart line features, and to expose portions of the second hard mask layer. The second hard mask layer is patterned to define therein a fourth mask element below the second mask element, a fifth mask element below the third mask element, and a sixth mask element aligned with a third pair of the spaced-apart line features. Portions of the second dielectric layer and the first hard mask layer not covered by the second mask layer are removed to define first, second and third line cut masks disposed between portions of the first, second and third pairs of spaced-apart line elements, respectively. The first dielectric layer is etched in the presence of the plurality of spaced-apart line elements and the first, second and third line cut masks to define first, second and third pairs of segmented line recesses. A conductive material is formed in the first, second and third pairs of segmented line recesses.

BRIEF DESCRIPTION OF THE DRAWINGS

The disclosure may be understood by reference to the following description taken in conjunction with the accompanying drawings, in which like reference numerals identify like elements, and in which.

Figure 1A:
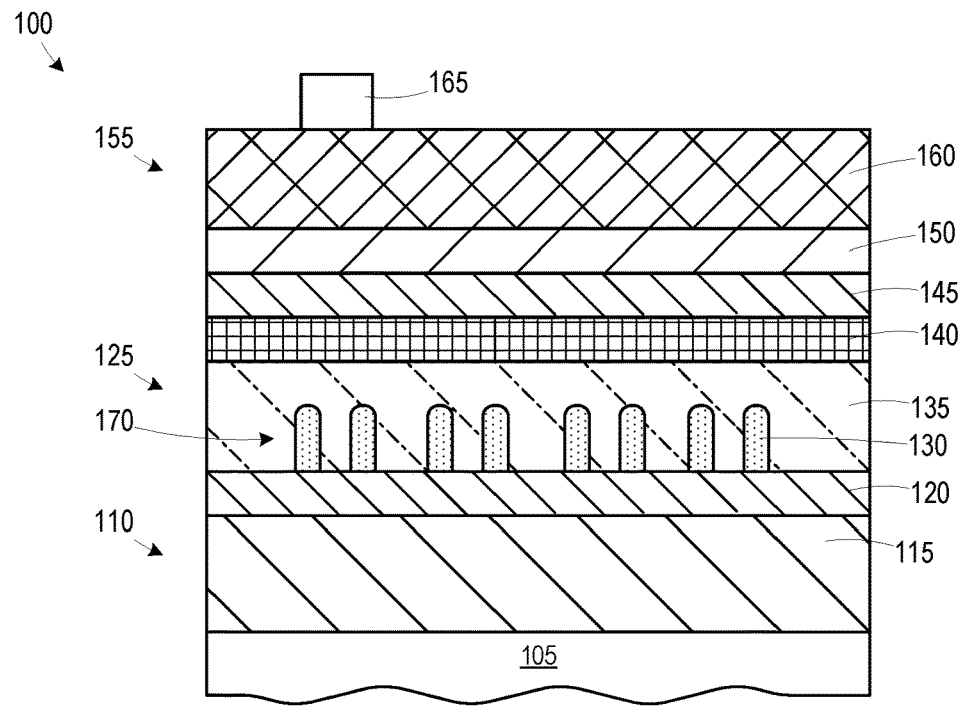
FIGS. 1A-1L are cross-sectional diagrams depicting illustrative techniques for performing a multiple patterning process for forming pillar mask elements.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The present disclosure is directed to various methods of forming an interconnect structure. With reference to the attached drawings various illustrative embodiments of the methods and devices disclosed herein will now be described in more detail.

FIGS. 1A-1L are cross-sectional diagrams illustrating a method for performing a multiple patterning process for forming pillar mask elements on a semiconductor product 100, which, in the present embodiment, may be represented by an integrated circuit including circuit elements, such as transistors, capacitors, resistors and the like. FIG. 1A illustrates the product 100 including a substrate 105 upon which a metallization layer 110 is formed. The metallization layer 110 includes a dielectric layer 115 in which conductive features (not shown) are to be embedded (e.g., metal lines). Semiconductor-based circuit elements may be provided on the substrate 105 in layers beneath the metallization layer 110, however, for convenience, such circuit elements are not shown in FIG. 1A. The substrate 105 may also include any appropriate microstructure features, such as micromechanical components, optoelectronic components and the like, wherein at least some of these components may require an interconnect structure formed in a metallization system. In highly complex integrated circuits, a very large number of electrical connections may be required and, thus, a plurality of metallization layers may typically be formed in the metallization system.

As shown in FIG. 1A, a hard mask layer 120 was formed above the first metallization layer 110 (i.e., the first dielectric layer 115). The hard mask layer 120 may include a single layer as illustrated (e.g., TiN) or a stack of layers (e.g., SiON covered by TiN). A mask structure 125 including a plurality of spaced-apart line elements 130 (e.g., extending into the page) and a second dielectric layer 135 (e.g., spin-on hard mask (SOH)) was formed above the hard mask layer 120. In some embodiments, the spaced-apart line elements 130 may be formed using an SADP process, where a mandrel is formed, spacers are formed on sidewalls of the mandrel, and the mandrel is removed. A SADP process may also be used to further decrease pitch, where the first set of spacers acts as a mandrel for a second set of spacers, and the first set of spacers is removed.

A stack of hard mask layers 140, 145, 150 was formed above the mask structure 125, and a patterning stack 155 was formed above the hard mask layer 150. In some embodiments, the patterning stack includes a mask layer 160 (e.g., stack including SOH, SiON and a back anti-reflective coating (BARC) layer) and a mask element 165 (e.g., patterned photoresist). The mask element 165 is aligned with a first pair 170 of the spaced-apart line elements 130. The mask element 165 is a pillar type element, as it only extends above a portion of the length of the spaced apart-line elements 130.

Figure 1B:
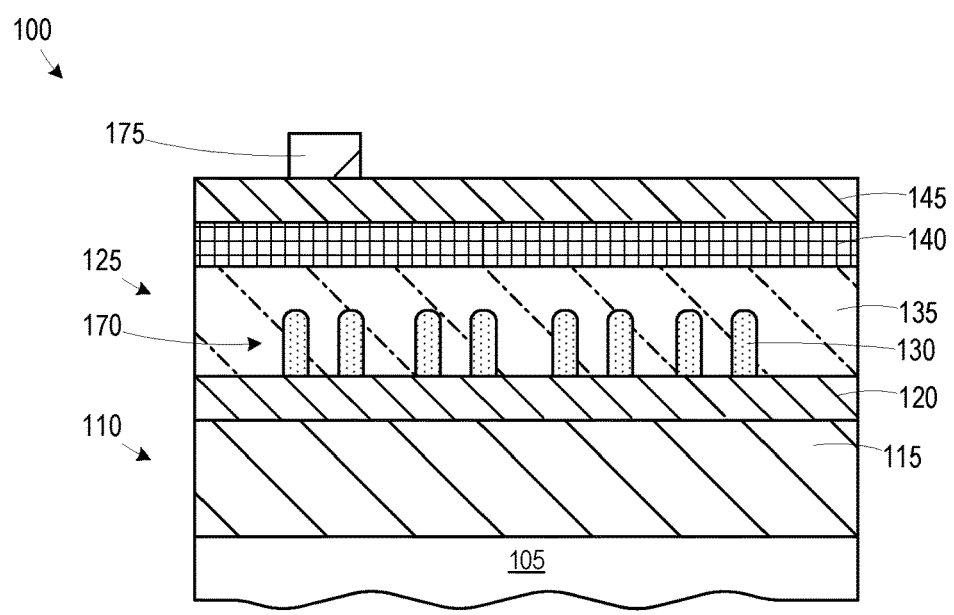

FIG. 1B illustrates the product 100 after a plurality of processes was performed to etch the hard mask layer 150 using the patterning stack 155 and to remove remnants of the patterning stack 155, thereby defining a mask element 175 in the hard mask layer 150 beneath the mask element 165.

Figure 1C:
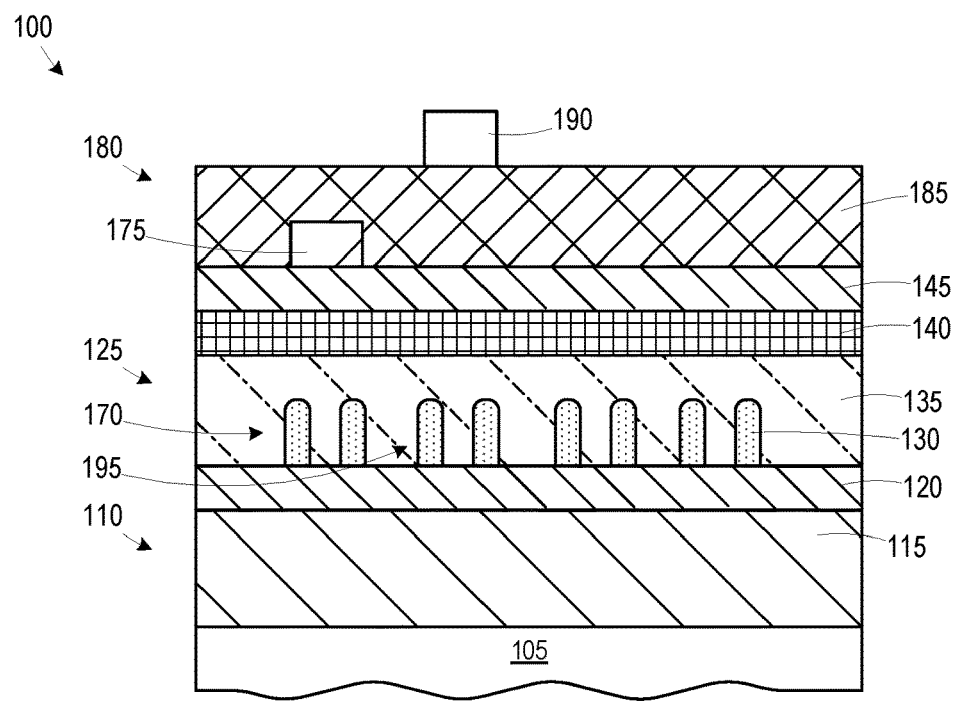

FIG. 1C illustrates the product 100 after a plurality of processes was performed to form a second patterning stack 180 including a mask layer 185 (e.g., stack including SOH, SiON and BARC) and a mask element 190 (e.g., patterned photoresist) above the hard mask layer 145 and the mask element 175. The mask element 190 is a pillar type element, as it only extends above a portion of the length of the spaced-apart line elements 130 and is aligned with a second pair 195 of the spaced-apart line elements 130.

Figure 1D:
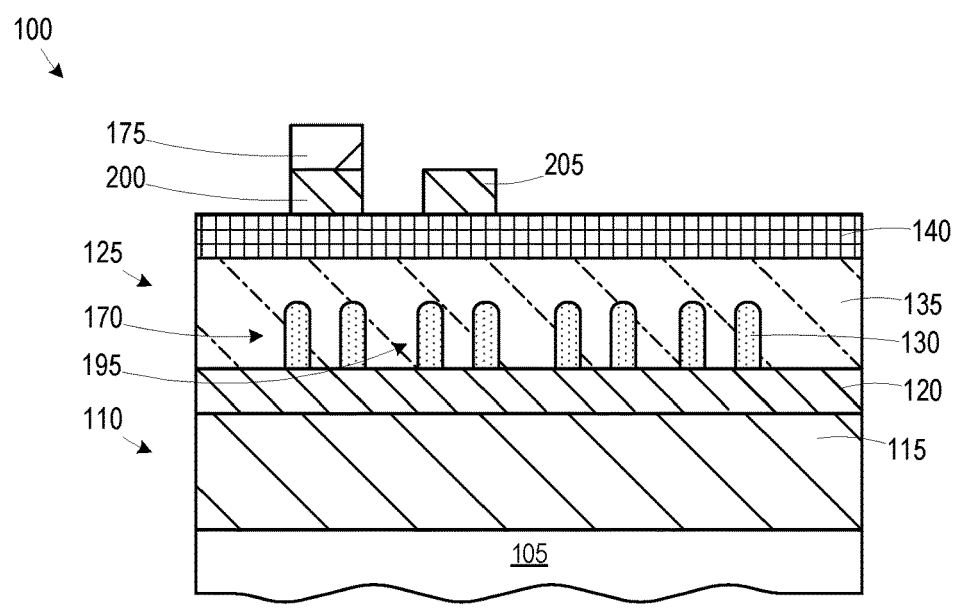

FIG. 1D illustrates the product 100 after a plurality of processes was performed to etch the hard mask layer 145 using the patterning stack 180 and to remove remnants of the patterning stack 180, thereby defining in the hard mask layer 145 a mask element 200 beneath the mask element 175 and a mask element 205 beneath the mask element 190.

Figure 1E:
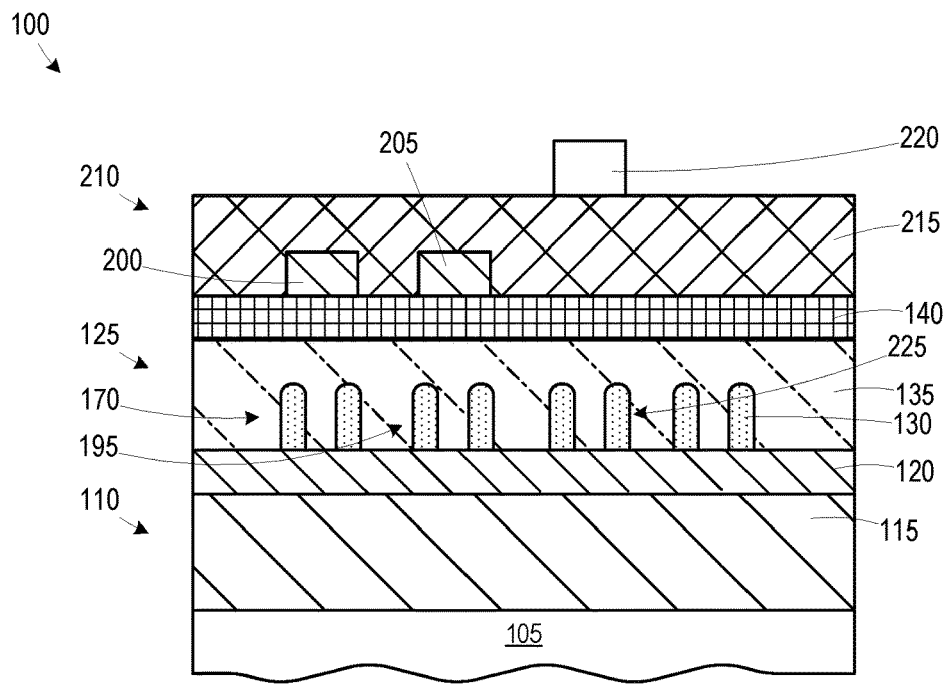

FIG. 1E illustrates the product 100 after a plurality of processes was performed to remove the mask element 175 and to form a third patterning stack 210 including a mask layer 215 (e.g., stack including SOH, SiON and BARC) and a mask element 220 (e.g., patterned photoresist) formed above the hard mask layer 140 and the mask elements 200, 205. The mask element 220 is a pillar type element, as it only extends above a portion of the length of the spaced-apart line elements 130 and is aligned with a third pair 225 of the spaced-apart line elements 130.

Figure 1F:
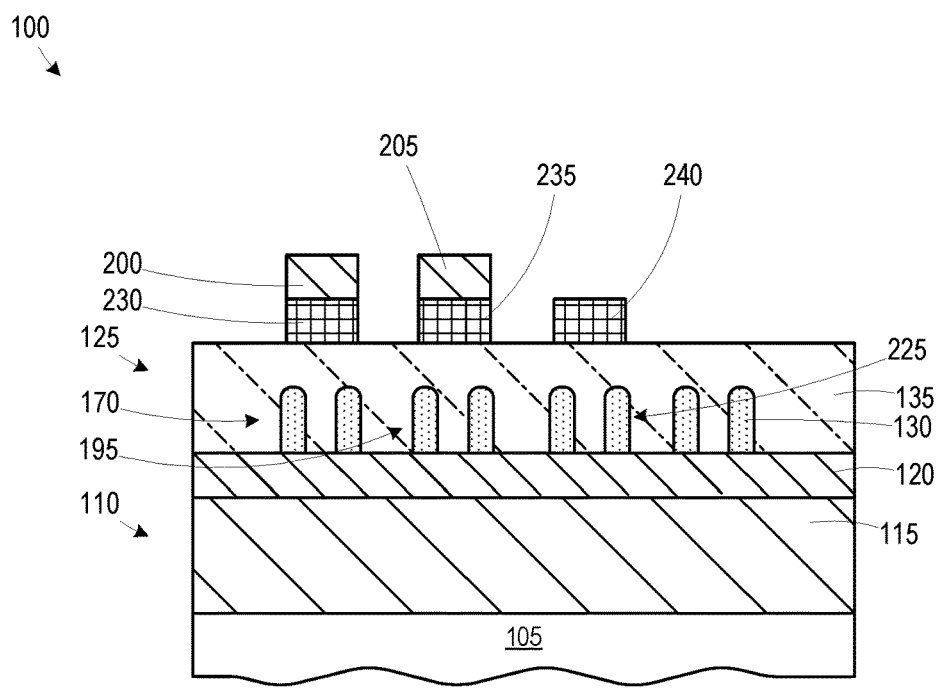

FIG. 1F illustrates the product 100 after a plurality of processes was performed to etch the hard mask layer 140 using the patterning stack 210 and to remove remnants of the patterning stack 210, thereby defining in the hard mask layer 140 a mask element 230 beneath the mask element 200, a mask element 235 beneath the mask element 205, and a mask element 240 beneath the mask element 220.

Figure 1G:
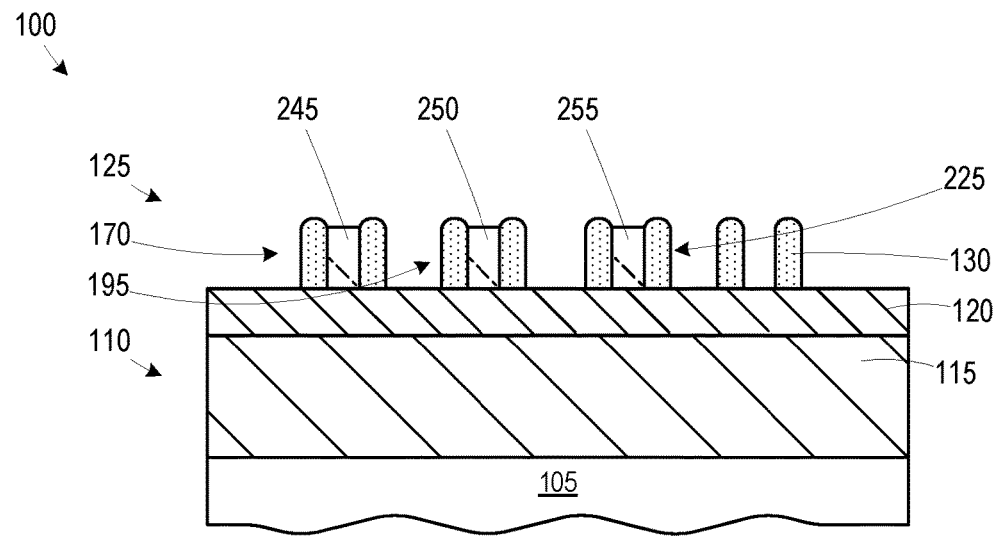

FIG. 1G illustrates the product 100 after a plurality of processes was performed to etch the mask structure 125 using the mask elements 230, 235, 240 as an etch mask. One or more etch processes were performed to remove portions of the dielectric layer 135 not covered by the mask elements 230, 235, 240, and to recess the dielectric layer 135 to form self-aligned line cut elements 245, 250, 255 between the respective pairs 170, 195, 225 of spaced-apart line elements 130. The mask elements 200, 205 may be removed during or prior to the etching of the mask structure 125. The mask elements 230, 235, 240 were also removed.

Figure 1H:
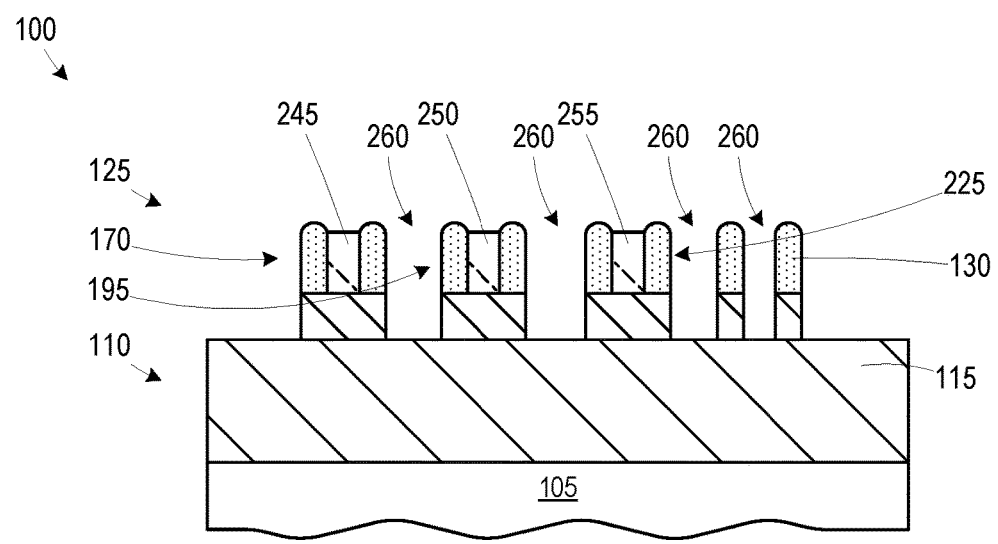

FIG. 1H illustrates the product 100 after an etch process was performed to etch the hard mask layer 120 using the spaced-apart line elements 130 and the line cut elements 245, 250, 255 as an etch mask to pattern line openings 260 in the hard mask layer 120.

Figure 1I:
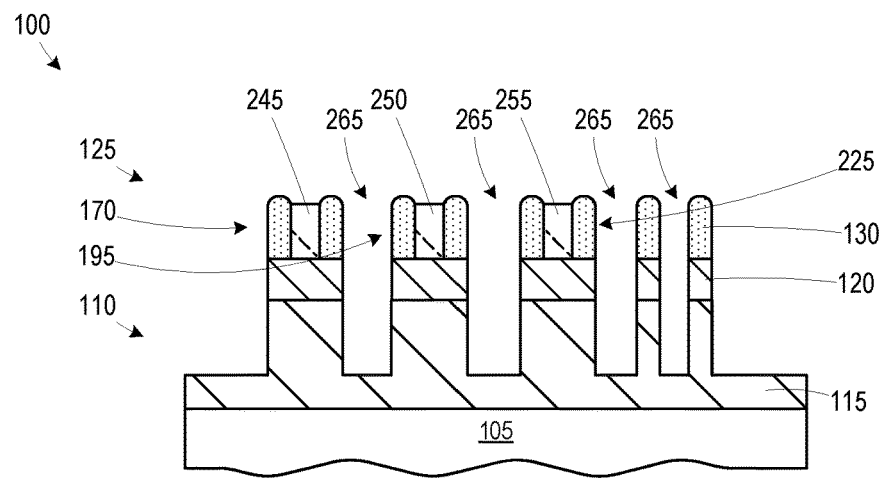

FIG. 1I illustrates the product 100 after an etch process was performed to etch the dielectric layer 115 to define recesses 265 therein.

Figure 1J:
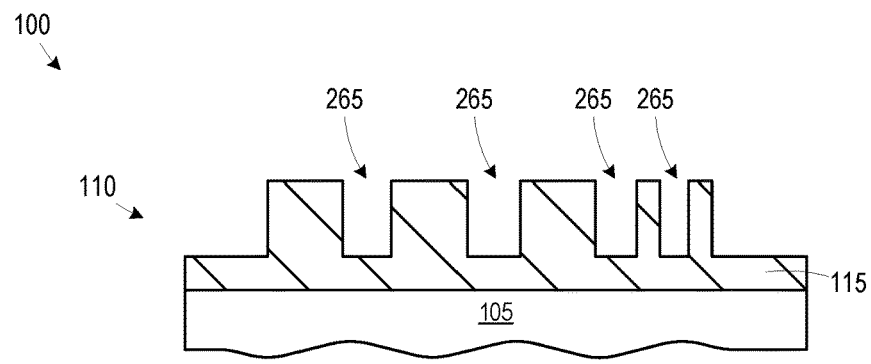

FIG. 1J illustrates the product after one or more etch processes were performed to remove remaining portions of the mask structure 125 and the hard mask layer 120.

Figure 1K:
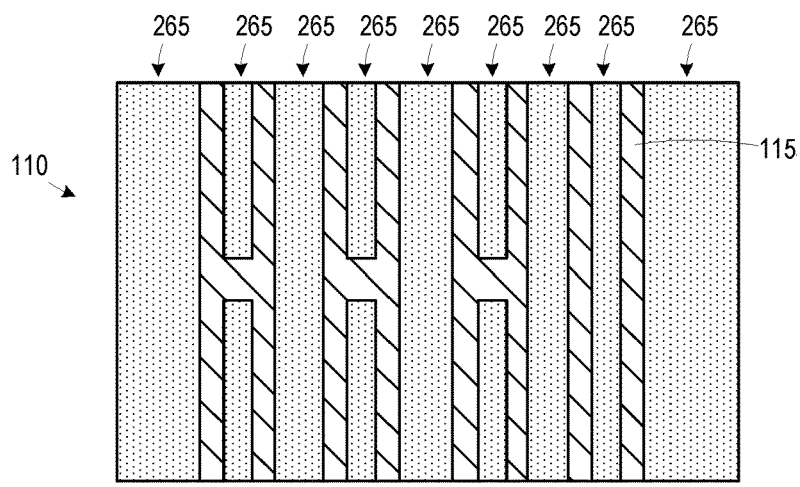

FIG. 1K illustrates a top view of the product 100 showing the recesses 265 in the dielectric layer 115. In regions where the self-aligned line cut elements 245, 250, 255 were disposed between the respective pairs 170, 195, 225 of the spaced-apart line elements 130, the recesses 265 are segmented or cut.

Figure 1L:
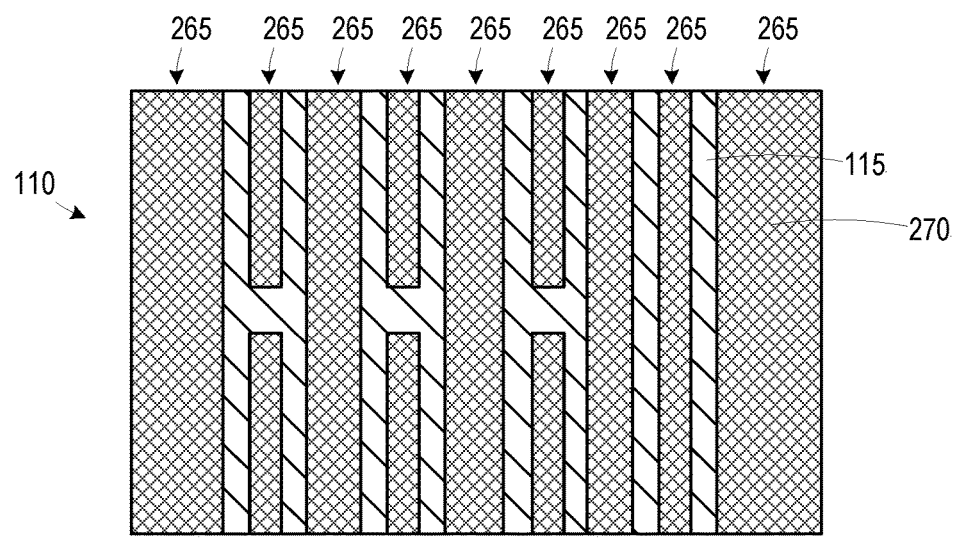

FIG. 1L illustrates the device 100 after a plurality of processes was performed to form a conductive material 270 in the recesses 265, thereby forming conductive lines. A deposition process (e.g., plating) was performed to deposit the conductive material 270 and a planarization process was performed to remove excess portions of the conductive material 270 extending above the dielectric layer 115. The conductive material 270 may include multiple layers (not shown), such as one or more barrier layers (e.g., Ta, TaN, TiN, etc.) to prevent migration of any metal in the conductive material 270 of the lines into the dielectric layer 115, a metal seed layer (e.g., copper), a metal fill material (e.g., copper), a metal silicide material, etc.

The use of a stack of hard mask layers 140, 145, 150 and separate patterning layers 155, 180, 210 allows the mask elements 230, 235, 240 to be formed without photolithography constraints regarding the spacing between the mask elements 230, 235, 240, even though the first, second and third pairs 170, 195, 225 of spaced-apart line elements 130 are immediately adjacent one another. The transfer of the mask elements to the lower hard mask layers is self-aligned, as is the formation of the line cut elements 245, 250, 255 beneath the mask elements 230, 235, 240 and disposed between the respective pairs 170, 195, 225 of the spaced-apart line elements 130.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a stack of hard mask layers above a process layer, said stack including first, second and third hard mask layers;
    patterning said third hard mask layer to define therein a first mask element from a remaining portion of said third hard mask layer and to expose portions of said second hard mask layer;
    patterning said second hard mask layer to define therein a second mask element below said first mask element and a third mask element, and to expose portions of said first hard mask layer, wherein said second and third mask elements are formed from remaining portions of said second hard mask layer;
    patterning said first hard mask layer to define therein a fourth mask element below said second mask element, a fifth mask element below said third mask element and a sixth mask element, and to expose portions of said process layer, wherein said fourth, fifth, and sixth mask elements are formed from remaining portions of said first hard mask layer; and
    etching said process layer to remove portions of said process layer not covered by said fourth, fifth, and sixth mask elements.

2. The method of claim 1, wherein said fourth, fifth and sixth mask elements comprise pillar mask elements.

3. The method of claim 2, wherein said process layer comprises a fourth hard mask layer, a plurality of spaced-apart line elements formed above said fourth hard mask layer, and a first dielectric layer formed above said fourth hard mask layer and said plurality of spaced-apart line elements, wherein said fourth, fifth and sixth mask elements are disposed above portions of first, second and third pairs of adjacent spaced-apart line elements, respectively.

4. The method of claim 3, wherein one of said first, second and third pairs of spaced-apart line elements is immediately adjacent the others of said first, second and third pairs of spaced-apart line elements.

5. The method of claim 3, further comprising removing portions of said second dielectric layer and said fourth hard mask layer not covered by said fourth, fifth and sixth mask elements to define first, second and third line cut masks above portions of said first, second and third pairs of spaced-apart line elements, respectively.

6. The method of claim 5, wherein a height of said first, second and third line cut masks is less than a height of said spaced-apart line elements.

7. The method of claim 5, further comprising:
etching a second dielectric layer disposed below said process layer in the presence of said plurality of spaced-apart line elements and said first, second and third line cut masks to define first, second and third pairs of segmented line recesses, respectively; and
forming a conductive material in said first, second and third pairs of segmented line recesses.

8. The method of claim 1, further comprising removing said first mask element after patterning said second hard mask layer.

9. The method of claim 8, further comprising removing said second and third mask elements after patterning said first hard mask layer.

10. A method, comprising:
forming a first dielectric layer above a substrate;
forming a first hard mask layer above said first dielectric layer;
forming a patterned etch mask comprising a plurality of spaced-apart line elements above said first hard mask layer;
forming a second dielectric layer above said patterned etch mask;
forming a second hard mask layer above said second dielectric layer;
forming a third hard mask layer above said second hard mask layer;
forming a fourth hard mask layer above said third hard mask layer;
patterning said fourth hard mask layer to define therein a first mask element aligned with a first pair of said spaced-apart line elements and to expose portions of said third hard mask layer;
patterning said third hard mask layer to define therein a second mask element below said first mask element and a third mask element aligned with a second pair of said spaced-apart line elements, and to expose portions of said second hard mask layer;
patterning said second hard mask layer to define therein a fourth mask element below said second mask element, a fifth mask element below said third mask element and a sixth mask element aligned with a third pair of said spaced-apart line elements;
removing portions of said second dielectric layer and said first hard mask layer not covered by said second mask layer to define first, second and third line cut masks disposed between portions of said first, second and third pairs of spaced-apart line elements, respectively;
etching said first dielectric layer in the presence of said plurality of spaced-apart line elements and said first, second and third line cut masks to define first, second and third pairs of segmented line recesses; and
forming a conductive material in said first, second and third pairs of segmented line recesses.

11. The method of claim 10, wherein said fourth, fifth and sixth mask elements comprise pillar mask elements.

12. The method of claim 10, wherein a height of said first, second and third line cut masks is less than a height of said spaced-apart line elements.

13. The method of claim 10, wherein one of said first, second and third pairs of spaced-apart line elements is immediately adjacent the others of said first, second and third pairs of spaced-apart line elements.

14. The method of claim 10, further comprising removing said first mask element after patterning said third hard mask layer.

15. The method of claim 14, further comprising removing said second and third mask elements after patterning said second hard mask layer.

16. A method, comprising:
forming a first dielectric layer above a substrate;
forming a first hard mask layer above said first dielectric layer;
forming a patterned etch mask comprising a plurality of spaced-apart line elements above said first hard mask layer;
forming a second dielectric layer above said patterned etch mask;
forming a second hard mask layer above said second dielectric layer;
forming a third hard mask layer above said second hard mask layer;
forming a fourth hard mask layer above said third hard mask layer;
forming a first line cut mask above said fourth hard mask layer and aligned with a first pair of said spaced-apart line elements;
patterning said fourth hard mask layer using said first line cut mask to define a first mask element and expose portions of said third hard mask layer;
forming a second line cut mask above said first mask element and said third hard mask layer and aligned with a second pair of said spaced-apart line elements;
patterning said third hard mask layer using said first mask element and said second line cut mask to define a second mask element below said first mask element, to define a third mask element, and to expose portions of said second hard mask layer;
forming a third line cut mask above said second and third mask elements and said second hard mask layer and aligned with a third pair of said spaced-apart line elements;
patterning said second hard mask layer using said second and third mask elements and said third line cut mask to define a fourth mask element below said second mask element, a fifth mask element below said third mask element, and a sixth mask element;
etching said second dielectric layer and said first hard mask layer in the presence of said fourth, fifth and sixth mask elements to define first, second and third line cut masks between said first, second and third pairs of spaced-apart line elements;
etching said first dielectric layer in the presence of said plurality of spaced-apart line elements and said first, second and third line cut masks to define first, second and third pairs of segmented line recesses; and
forming a conductive material in said first, second and third pairs of segmented line recesses.

17. The method of claim 16, further comprising removing said first mask element after patterning said third hard mask layer.

18. The method of claim 17, further comprising removing said second and third mask elements after patterning said second hard mask layer.

* * * * *